(12) United States Patent
Christensen et al.

(10) Patent No.: US 10,886,575 B2
(45) Date of Patent: *Jan. 5, 2021

(54) EVALUATING CAPACITY FADE IN DUAL INSERTION BATTERIES USING POTENTIAL AND TEMPERATURE MEASUREMENTS

(71) Applicant: Robert Bosch GmbH, Stuttgart (DE)

(72) Inventors: John F. Christensen, Elk Grove, CA (US); Reinhardt Klein, Mountain View, CA (US); Abdul-Kader Srouji, San Francisco, CA (US); Ashish Krupadanam, Cupertino, CA (US); Anahita MirTabatabaei, San Francisco, CA (US); Nikhil Ravi, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/196,978

(22) Filed: Nov. 20, 2018

(65) Prior Publication Data

US 2019/0089018 A1 Mar. 21, 2019

Related U.S. Application Data

(63) Continuation of application No. 15/072,839, filed on Mar. 17, 2016, now Pat. No. 10,224,579.

(Continued)

(51) Int. Cl.
*H02J 7/00* (2006.01)
*H01M 10/42* (2006.01)
(Continued)

(52) U.S. Cl.
CPC ...... *H01M 10/4257* (2013.01); *G01R 31/367* (2019.01); *G01R 31/392* (2019.01);
(Continued)

(58) Field of Classification Search
CPC . H05B 47/19; H02J 9/02; H02J 7/0086; H02J 7/00; H02J 7/007; H02J 9/065;
(Continued)

(56) References Cited

U.S. PATENT DOCUMENTS 6,515,456 B1 2/2003 Mixon
6,534,954 B1 3/2003 Plett
(Continued)

FOREIGN PATENT DOCUMENTS

DE 102005008511 8/2006
EP 2816366 12/2014
(Continued)

OTHER PUBLICATIONS

Notice of Allowance from the U.S. Patent and Trademark Office for U.S. Appl. No. 15/273,040 dated Feb. 4, 2019 (8 pages).
(Continued)

*Primary Examiner* — Binh C Tat
(74) *Attorney, Agent, or Firm* — Michael Best & Friedrich LLP

(57) ABSTRACT

Methods and systems are described of managing a battery system. The battery system including at least one battery cell and one or more sensors configured to measure a temperature of the at least one battery cell. The method includes receiving a measurement of the temperature of the at least one battery cell, estimating an open circuit potential of the at least one battery cell, estimating a capacity fade of the at least one battery cell based on the open circuit potential of the at least one battery cell and a ratio of a change in the open circuit potential relative to a change in the temperature of the at least one battery cell, and regulating at least one of charging or discharging of the at least one battery cell based on the estimation of the capacity fade.

20 Claims, 6 Drawing Sheets

Related U.S. Application Data

(60) Provisional application No. 62/273,599, filed on Dec. 31, 2015.

(51) Int. Cl.

| | | |
|---|---|---|
| *G01R 31/367* | (2019.01) | |
| *G01R 31/392* | (2019.01) | |
| *H01M 10/44* | (2006.01) | |
| *H01M 10/48* | (2006.01) | |
| *H01M 10/613* | (2014.01) | |
| *H01M 10/615* | (2014.01) | |
| *H01M 10/623* | (2014.01) | |
| *H01M 10/625* | (2014.01) | |
| *H01M 10/633* | (2014.01) | |
| *G01R 31/3835* | (2019.01) | |
| *H01M 10/6567* | (2014.01) | |

(52) U.S. Cl.
CPC ....... *H01M 10/425* (2013.01); *H01M 10/443* (2013.01); *H01M 10/48* (2013.01); *H01M 10/482* (2013.01); *H01M 10/486* (2013.01); *H01M 10/613* (2015.04); *H01M 10/615* (2015.04); *H01M 10/623* (2015.04); *H01M 10/625* (2015.04); *H01M 10/633* (2015.04); *H02J 7/0086* (2013.01); *H02J 7/0091* (2013.01); *G01R 31/3835* (2019.01); *H01M 10/6567* (2015.04); *H01M 2010/4271* (2013.01); *H01M 2010/4278* (2013.01); *H01M 2220/20* (2013.01); *H01M 2220/30* (2013.01); *H02J 7/0068* (2013.01)

(58) Field of Classification Search
CPC ........ H02J 7/0047; H02J 7/00711; H02J 7/34; H02J 7/0048; H02J 7/0068; H02J 7/345; H02J 9/061; H02J 13/00006; H02J 13/00017; H02J 13/0017; H02J 7/0021; H02J 50/00; H02J 50/10; H02J 50/40; H02J 7/0029; H02J 7/00306; H02J 7/00308; H02J 7/0042; H02J 7/025; H02J 3/00; H02J 7/0091; H02J 1/102; H02J 2207/20; H02J 7/0016; H01M 10/44; H01M 2220/20; H01M 10/4257; H01M 10/486; H01M 2010/4271; H01M 10/0525; H01M 2200/20; Y02T 10/70; F21S 2/00; G01R 31/36; G01R 31/392
USPC .................................................. 320/125–134
See application file for complete search history.

(56) References Cited

U.S. PATENT DOCUMENTS

| | | | |
|---|---|---|---|
| 7,081,755 B2 | 7/2006 | Klang et al. | |
| 7,612,532 B2 | 11/2009 | Verbrugge | |
| 7,994,755 B2 | 8/2011 | Plett | |
| 8,008,891 B2 | 8/2011 | Yun et al. | |
| 8,103,485 B2 | 1/2012 | Plett | |
| 8,116,998 B2 | 2/2012 | Hess | |
| 8,188,715 B2 | 5/2012 | Christensen et al. | |
| 8,310,201 B1 | 11/2012 | Wright | |
| 8,321,164 B2 | 11/2012 | Liu et al. | |
| 8,346,495 B2 | 1/2013 | Gering | |
| 8,467,984 B2 | 6/2013 | Gering | |
| 8,548,762 B2 | 10/2013 | Prada et al. | |
| 8,635,038 B2 | 1/2014 | Benjamin et al. | |
| 8,896,315 B1 | 11/2014 | Davies | |
| 8,965,723 B2 | 2/2015 | Jo et al. | |
| 9,086,462 B2 | 7/2015 | Mao | |
| 9,960,625 B2 | 5/2018 | Klein et al. | |
| 10,107,865 B2 | 10/2018 | Choi | |
| 10,224,579 B2 * | 3/2019 | Christensen | ......... H01M 10/48 |
| 2001/0032666 A1 | 10/2001 | Jenson et al. | |
| 2002/0097026 A1 | 7/2002 | Kernahan et al. | |
| 2003/0076109 A1 | 4/2003 | Verbrugge et al. | |
| 2004/0135548 A1 | 7/2004 | Takano et al. | |
| 2004/0220758 A1 | 11/2004 | Barsoukov et al. | |
| 2006/0111854 A1 | 5/2006 | Plett | |
| 2006/0170397 A1 | 8/2006 | Srinivasan et al. | |
| 2006/0284600 A1 | 12/2006 | Verbrugge | |
| 2007/0299620 A1 | 12/2007 | Yun et al. | |
| 2008/0074082 A1 | 3/2008 | Tae et al. | |
| 2008/0103709 A1 | 5/2008 | Yun et al. | |
| 2008/0281244 A1 | 11/2008 | Jacobs | |
| 2009/0210179 A1 | 8/2009 | Tang et al. | |
| 2009/0326842 A1 | 12/2009 | Thomas-Alyea | |
| 2010/0033132 A1 | 2/2010 | Nishi et al. | |
| 2010/0085057 A1 | 4/2010 | Nishi et al. | |
| 2011/0025258 A1 | 2/2011 | Kim et al. | |
| 2011/0288797 A1 | 11/2011 | Schmidt | |
| 2012/0101753 A1 | 4/2012 | Lin et al. | |
| 2012/0105001 A1* | 5/2012 | Gallegos | ............... B60L 3/0046 320/109 |
| 2012/0109443 A1 | 5/2012 | Takahashi et al. | |
| 2012/0150507 A1 | 6/2012 | Gallestey et al. | |
| 2012/0175953 A1 | 7/2012 | Ohkawa et al. | |
| 2012/0200298 A1 | 8/2012 | Zhang et al. | |
| 2012/0268074 A1* | 10/2012 | Cooley | ................... H01G 11/58 320/130 |
| 2012/0299552 A1 | 11/2012 | Machida | |
| 2012/0306438 A1 | 12/2012 | Howard et al. | |
| 2012/0313449 A1 | 12/2012 | Kurs et al. | |
| 2013/0006454 A1 | 1/2013 | Li et al. | |
| 2013/0051587 A1 | 2/2013 | Stephanou et al. | |
| 2013/0085696 A1 | 4/2013 | Xu et al. | |
| 2013/0086409 A1 | 4/2013 | Lu et al. | |
| 2013/0300190 A1 | 11/2013 | Mao et al. | |
| 2013/0300377 A1 | 11/2013 | Mao et al. | |
| 2013/0322488 A1 | 12/2013 | Yazami et al. | |
| 2014/0015488 A1 | 1/2014 | Despesse | |
| 2014/0055488 A1* | 2/2014 | Masters | .................. G06F 3/147 345/633 |
| 2014/0089692 A1 | 3/2014 | Hanafusa | |
| 2014/0222358 A1 | 8/2014 | Morita et al. | |
| 2014/0225620 A1 | 8/2014 | Campbell et al. | |
| 2014/0229129 A1 | 8/2014 | Campbelle et al. | |
| 2014/0236511 A1 | 8/2014 | Kulkarni et al. | |
| 2014/0244225 A1 | 8/2014 | Balasingam et al. | |
| 2014/0278167 A1 | 9/2014 | Frost et al. | |
| 2014/0342193 A1 | 11/2014 | Mull et al. | |
| 2014/0350877 A1 | 11/2014 | Chow et al. | |
| 2015/0022157 A1 | 1/2015 | Takahashi | |
| 2015/0046106 A1 | 2/2015 | Wade et al. | |
| 2015/0046108 A1 | 2/2015 | Akamine | |
| 2015/0066406 A1 | 3/2015 | Sun et al. | |
| 2015/0147608 A1 | 5/2015 | Lin et al. | |
| 2015/0197164 A1 | 7/2015 | Lee | |
| 2015/0226807 A1 | 8/2015 | Aumentado et al. | |
| 2015/0234013 A1 | 8/2015 | Migita et al. | |
| 2015/0248149 A1 | 9/2015 | Yamazaki et al. | |
| 2015/0251555 A1 | 9/2015 | Li et al. | |
| 2015/0251556 A1 | 9/2015 | Meyer | |
| 2015/0260800 A1 | 9/2015 | Baba et al. | |
| 2015/0268306 A1 | 9/2015 | Sugiyama et al. | |
| 2015/0302723 A1 | 10/2015 | Reade et al. | |
| 2015/0326038 A1 | 11/2015 | Lee | |
| 2015/0355615 A1 | 12/2015 | Lee | |
| 2016/0046199 A1 | 2/2016 | Butler et al. | |
| 2016/0090001 A1 | 3/2016 | Nomoto et al. | |
| 2016/0241058 A1 | 8/2016 | Carralero et al. | |
| 2016/0259011 A1 | 9/2016 | Joe | |
| 2017/0144562 A1 | 5/2017 | Thomas et al. | |
| 2017/0194669 A1 | 7/2017 | Christensen et al. | |
| 2017/0222447 A1 | 8/2017 | Ravi et al. | |
| 2017/0222448 A1 | 8/2017 | MirTabatabaei et al. | |
| 2017/0222449 A1 | 8/2017 | MirTabatabaei et al. | |
| 2017/0271984 A1 | 9/2017 | Kohn et al. | |

(56) References Cited

U.S. PATENT DOCUMENTS

| | | |
|---|---|---|
| 2018/0083461 A1 | 3/2018 | Ravi et al. |
| 2018/0313904 A1 | 11/2018 | Heiries et al. |

FOREIGN PATENT DOCUMENTS

| | | |
|---|---|---|
| KR | 20150043214 | 4/2015 |
| WO | WO 2006/057468 | 6/2006 |
| WO | WO 2006/057469 | 6/2006 |
| WO | WO 2008/154956 | 12/2008 |
| WO | WO 2011050924 | 5/2011 |
| WO | WO 2014/130519 | 8/2014 |
| WO | WO 2015/025212 | 2/2015 |
| WO | WO 2015/056963 | 4/2015 |
| WO | WO 2015/056964 | 4/2015 |
| WO | WO 2015/185802 | 12/2015 |

OTHER PUBLICATIONS

B. F. Lund and B. A. Foss, "Parameter ranking by orthogonalization—Applied to nonlinear mechanistic models," Automatica, vol. 44, No. 1, pp. 278-281, 2008.

Fuller et al., "Simulation and Optimization of the Dual Lithium Ion Insertion Cell," J. Electrochem. Soc., vol. 141, No. 1, Jan. 1994, pp. 1-10.

Ioannou et al., "Robust adaptive control." Courier Corporation, 2012.

K. Thomas, J. Newman and R. Darling, "Mathematical Modeling of Lithium Batteries," Kluwer Academic/Plenum Publishers, pp. 345-392, 2002.

Klein, R. et al., 2013. "Electrochemical Model Based Observer Design for a Lithium-Ion Battery." Control Systems Technology, IEEE Transactions on, 21(2), pp. 289-301.

M. Doyle, T.F. Fuller, J. Newman, "Modeling of Galvanostatic Charge and Discharge of the Lithium/Polymer/Insertion Cell", Journal of the Electrochemical Society, 1993.

Mayhew et al., "Investigation of projection-based model-reduction techniques for solid-phase diffusion in Li-ion batteries," American Control Conference (ACC), 2014, pp. 123-128, Jun. 4-6, 2014.

Moura et al., "Adaptive PDE Observer for Battery SOC/SOH Estimation," ASME 2012 5th Annual Dynamic Systems and Control Conference joint with the JSME 2012 11th Motion and Vibration Conference, 2012 (10 pages).

Murray, Chapter 3, State Estimation, Caltech, (https://www.cds.caltech.edu/~murray/wiki/images/b/b3/Stateestim.pdf) available online as early as Sep. 20, 2006, pp. 9-17.

N. Chaturvedi, et al., "Modeling, estimation, and control challenges for lithium-ion batteries," 2010 American Control Conference, pp. 1997-2002, 2010.

N. Chaturvedi, J. Christensen, R. Klein and A. Kojic, "Approximations for Partial Differential Equations Appearing in Li-Ion Battery Models," ASME 2013 Dynamic Systems and Control Conference (10 pages).

N. Chaturvedi, R. Klein, J. Christensen, J. Ahmed and A. Kojic, "Algorithms for Advanced Battery Management Systems," IEEE Control Systems Magazine, vol. 30, No. 3, pp. 49-68, 2010.

Pattel, "An Evaluation of the Moving Horizon Estimation Algorithm for Online Estimation of Battery State of Charge and State" Thesis, Purdue University, Dec. 2014.

Ramadesigan et al., "Modeling and Simulation of Lithium-Ion Batteries from a Systems Engineering Perspective," Journal of the Elect rochemical Society, 159 (3) R3 I-R45 (2012).

Rao, C. V., Rawlings, J. B., & Mayne, D. Q. (2003). "Constrained state estimation for nonlinear discrete-time systems: Stability and moving horizon approximations." Automatic Control, IEEE Transactions, 48(2), 246-258.

Tenny, M. J., & Rawlings, J. B. (2002). "Efficient moving horizon estimation and nonlinear model predictive control." In American Control Conference, 2002. Proceedings of the 2002 (vol. 6, pp. 4475-4480). IEEE.

Thomas, "Lithium-Ion Batteries: Thermal and Interfacial Phenomena," Dissertation, Princeton University, 1996, published 2002, pp. 66-73.

Written Opinion of the International Searching Authority for Application No. PCT/EP2017/051333 dated May 9, 2017 (10 pages).

International Search Report for Application No. PCT/EP2017/051325 dated Apr. 7, 2017 (5 pages).

Ma Yan et al., "Lithium-ion Battery State of Charge Estimation based on Moving Horizon", Proceedings of the 11th World Congress on Intelligent Control and Automation, Jun. 29, 2014 (Jun. 29, 2014),-Jul. 4, 2014 (Jul. 4, 2014), pp. 5002-5007.

Sridhar Ungarala, "Computing arrival cost parameters in moving horizon estimation using sampling based filters", Journal of Process Control, vol. 19, No.-9, Oct. 2009 (Oct. 2009), pp. 1576-1588.

Non-Final Office Action from the U.S. Patent and Trademark Office for U.S. Appl. No. 15/010,873 dated Aug. 31, 2018 (9 pages).

Abu-Sharkh et al., "Rapid test and non-linear model characterisation of solid-state lithium-ion batteries", Journal of Power Sources, vol. 130, 2004, pp. 266-274.

Bloom et al., "Differential voltage analyses of high-power, lithium-ion cells 1. Technique and application", Journal of Power Sources, vol. 139, 2005, pp. 295-303.

Christensen et al., "Cyclable Lithium and Capacity Loss in Li-Ion Cells", Journal of the Electrochemical Society, vol. 152, No. 4, 2005, pp. A818-A829.

Christensen et al., "Effect of Anode Film Resistance on the Charge/Discharge Capacity of a Lithium-Ion Battery", Journal of the Electrochemical Society, vol. 150, No. 11, 2003, pp. A1416-A1420.

\* cited by examiner

EVALUATING CAPACITY FADE IN DUAL INSERTION BATTERIES USING POTENTIAL AND TEMPERATURE MEASUREMENTS

CROSS-REFERENCE TO RELATED APPLICATIONS

This application is a continuation of U.S. patent application Ser. No. 15/072,839, filed on Mar. 17, 2016, which claims the benefit of U.S. Provisional Application 62/273,599, filed on Dec. 31, 2015, the entire contents of which are hereby incorporated by reference.

STATEMENT REGARDING FEDERALLY SPONSORED RESEARCH

This invention was made with government support under ARPA-E Award Number DE-AR0000278 awarded by the U.S. Department of Energy. The U.S. government has certain rights in the invention.

FIELD

The invention generally relates to methods and systems for determining a state of charge and a capacity fade of a secondary battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

Over the life of an electrochemical cell, the charge capacity can be lost due to side reactions and/or active material loss. For example, undesirable side reactions occur during repeated charge/discharge cycles of the battery. These undesirable side reactions result in the reduction of the capacity of the battery to provide and store power. This also results in changes in the relationship between the "open circuit potential" (OCP) and charge capacity of the cell.

SUMMARY

In some embodiments, the invention provides a method of determining the extent and type of capacity fade in a dual intercalation battery (e.g., a lithium-ion battery). Open-circuit potentials of the active materials in the positive and negative electrodes are experimentally determined (i.e., estimated) as a function of temperature and state of charge (e.g., as a function of lithium content in materials used in lithium-ion batteries). This technique allows for the determination of the battery's capacity when only a limited capacity or state-of-charge range is sampled. This is particularly valuable for applications such as hybrid-electric vehicles in which the entire available capacity range of the battery is not accessed during normal operation. It is also useful in that it does not require the complete discharge of a battery in order to diagnose the current charge capacity of the battery.

In some embodiments, the invention provides a method of managing a battery system. The battery system including at least one battery cell and one or more sensors configured to measure a temperature of the at least one battery cell. The method includes receiving, by a computer-based battery management system from the one or more sensors, a measurement of the temperature of the at least one battery cell, estimating, by the battery management system, an open circuit potential of the at least one battery cell, estimating, by the battery management system, a capacity fade of the at least one battery cell based on the open circuit potential of the at least one battery cell and a ratio of a change in the open circuit potential relative to a change in the temperature of the at least one battery cell, and regulating, by the battery management system, at least one of charging or discharging of the at least one battery cell based on the estimation of the capacity fade.

In some embodiments, the invention provides a battery system comprising at least one battery cell, one or more sensors, and a battery management system. The one or more sensors are configured to measure a temperature of the at least one battery cell. The battery management system includes an electronic processor configured to receive a measurement of the temperature of the at least one battery cell from the one or more sensors, estimate an open circuit potential of the at least one battery cell, estimate a capacity fade of the at least one battery cell based on the open circuit potential of the at least one battery cell and a ratio of a change in the open circuit potential relative to a change in the temperature of the at least one battery cell, and regulate at least one of charging or discharging of the at least one battery cell based on the capacity fade.

In some embodiments, by including dU/dT (i.e., a ratio of change in open-circuit potential (OCP) estimates (or measurements) relative to a change in temperature measurements) along with estimates (or measurements) of just the open-circuit potential U, more information (2× the data points) is available for every state of charge of the battery at which the estimate is made. As such, in some embodiments, the system is able to increase the overall speed of collecting a requisite number of data points for an accurate estimation and classification of capacity fade by varying the temperature of the battery instead of varying the state of charge. In some embodiments (e.g., where the temperature is not controllably varied to collect data points), natural variations of temperature allow the system to collect multiple useful data points at each resting state of charge.

In some embodiments, the shape of the dU/dT function (i.e., the ratio of change in OCP relative to change in temperature) with respect to state of charge for each material and for each full cell is used to provide a richer data set from which to extract a more precise estimated of the amount and type of capacity fade in the cell. Also, the shapes of the dU/dT function and the U function, both with respect to state of charge (SOC), may be complementary, such that the estimate is accurate and precise over a wider operating window of the battery. Accurate estimates of the battery state of health, including the extent and type of capacity fade, in turn enable better estimates of battery state of charge and power capability over the lifetime of the battery. Moreover, accurate estimates of the extent and type of capacity fade

DETAILED DESCRIPTION

Figure 1:
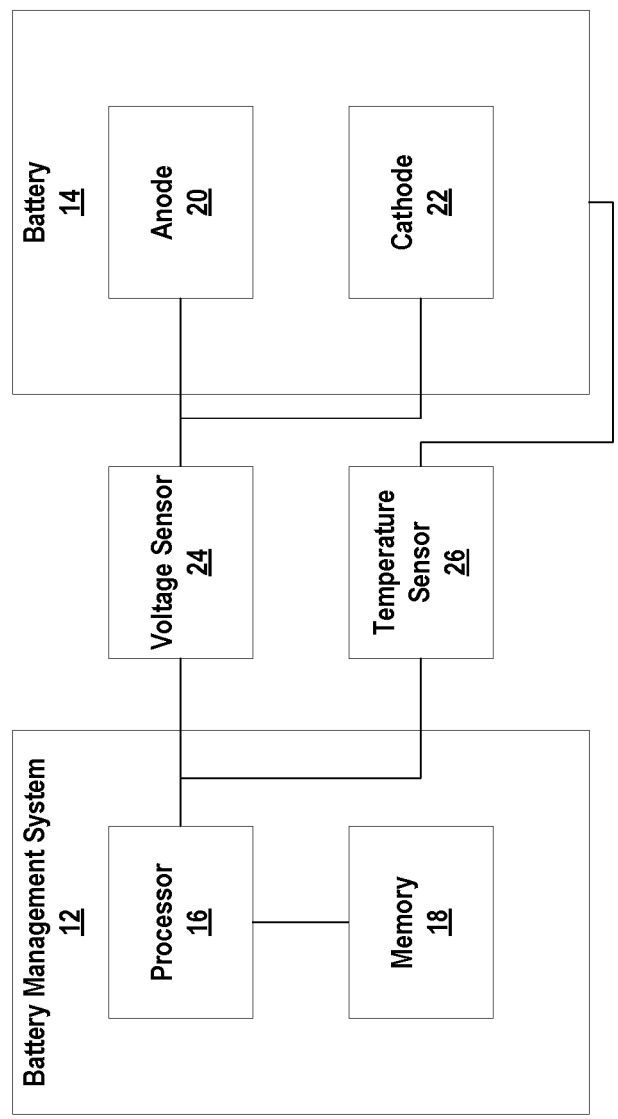
FIG. 1 is a block diagram of a battery system according to one embodiment.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

The open-circuit potential of a battery cell is defined in terms of the measured voltage of the battery cell (i.e., the "battery cell voltage" or "V"). A voltmeter or other sensor with leads attached to the positive and negative terminals of the battery cell can be used to measure the battery cell voltage. The battery cell voltage is the difference in potential of the positive and negative terminals of the battery cell. The battery cell voltage may vary as current is passed through the battery cell via the positive and negative terminals. The battery cell voltage may also vary when no current is applied to or drawn from the battery cell due to the relaxation of concentration gradients within the battery cell. When the concentration gradients reach zero (e.g., uniform concentration in each phase of the battery cell) and no current is flowing through the battery cell, the battery cell voltage is equal to an equilibrium potential of the battery cell, or "open-circuit potential." The equilibrium potential is achieved when the battery cell relaxes (i.e., zero current) for an infinite period of time. In practical applications the battery cell does not relax for an infinite period of time. Accordingly, the battery cell achieves a "quasi equilibrium" state where the battery cell voltage changes very slowly with time, the concentration profiles are nearly flat, and negligible current is flowing within the battery cell. The quasi equilibrium state occurs during long "rest periods" of zero applied current and removal of load from the battery cell. In the following discussion of OCP measurements, it is understood that a battery management system (BMS) measures the battery cell voltage, monitors the change of the battery cell voltage with time, and extracts (i.e., estimates) an OCP only when the battery cell is sufficiently relaxed (e.g., $dV/dt < \varepsilon$, where $\varepsilon$ is a small number, usually less than 3 millivolts per hour (mV/hour)). It is also understood that OCP measurements as described herein are estimates of the values of the OCP based on the measurements of the battery cell voltage when the battery cell is sufficiently relaxed. Additionally or alternatively, the BMS may use a mathematical model for the battery cell and parameter estimation algorithms to determine (i.e., estimate) the value of the OCP even while the battery cell is under load.

Additionally or alternatively, the BMS may extrapolate (i.e., estimate) a value of the OCP from the measured battery cell voltage versus time data. For example, the BMS fits a decaying exponential to the measured battery cell voltage versus time data to extrapolate a value of the OCP. As described at col. 5, lines 36-58 of U.S. Pat. No. 8,188,715 B2, which is hereby incorporated by reference in its entirety, in one of the quickest approaches, the cell is discharged a fraction of its capacity, and allowed to relax for a short time (e.g., 90 seconds). The shape of the voltage decay curve (the change in the measured OCP versus time) is then used to estimate the $OCP_A$. The fit that is used may be exponential or a series of exponential forms. Other functional forms may be used to fit the data to provide more accuracy in the $OCP_A/C_A$ estimate. The time segment that is fit to the exponential curve in this fast approach depends upon cell chemistry and state of charge. Typically the first several seconds of the relaxation is not used in the fitting procedure. The foregoing steps are then repeated to cover the capacity range of interest or the capacity range to which the data is limited by operational constraints. While the voltage decay curve obtained through this approach does not strictly follow a given functional form, the result may be close enough to derive a sufficiently good approximation of the $OCP_A/C_A$ relationship. In systems where hysteresis is negligible, the average of the charge and discharge curves may be used. Alternatively, if the hysteresis as a function of the SOCs of individual half cells has previously been measured, the previously measured value may be used. Finally, a physical model of the electrochemical cell can be used to estimate the $OCP_A/C_A$ relationship from a history of measurements of the cell voltage and current.

The relationship between active electrode material capacities, cyclable lithium, and the ratio of change in open-circuit potential (OCP), U, relative to temperature, T, of a complete battery cell can be represented by mathematical equations. In particular, for a blended electrode, i.e., one that has more than one active electrode material, the overall state of charge (SOC) of the electrode is given by the weighted sum of the individual materials SOCs as follows:

$$y = \sum_i f_i y_i \tag{1}$$

where, $y_i$ is the SOC of each individual material, y is the composite SOC, $f_i$ is the fraction of Li sites present in each material i and where $$1 = \sum_i f_i \tag{2}$$

The equilibrium voltage of the mixed electrode is equal to the open-circuit potentials of each component at its respective SOC. That is, for every material i, $$U(y) = U_i(y_i) \tag{3}$$

To obtain dU/dy (i.e., the ratio of change in open-circuit potential relative to a change in the SOC), we take the reciprocal of the differential of equation (1):

$$\left(\frac{\partial U}{\partial y}\right)_T = \left[\sum_i f_i \left(\frac{\partial U_i}{\partial y_i}\right)_T^{-1}\right]^{-1} \tag{4}$$

where equation (3) is used to write $dU/dy_i$ in terms of the measured properties $U_i(y_i)$. To obtain dU/dT (i.e., the ratio of change in open-circuit potential relative to a change in the temperature (T)), we differentiate equation (1) with respect to T as:

$$\left(\frac{\partial y}{\partial T}\right)_U = \sum_i f_i \left(\frac{\partial y_i}{\partial T}\right)_{U_i} \tag{5}$$

Employing the identity:

$$\left(\frac{\partial A}{\partial B}\right)_C \left(\frac{\partial B}{\partial C}\right)_A \left(\frac{\partial C}{\partial A}\right)_B = -1 \tag{6}$$

we find that $$\left(\frac{\partial U}{\partial T}\right)_y = \frac{\sum_i f_i \left(\frac{\partial U_i}{\partial T}\right)_{y_i} \left(\frac{\partial U_i}{\partial y_i}\right)_T^{-1}}{\sum_i f_i \left(\frac{\partial U_i}{\partial y_i}\right)_T^{-1}} \tag{7}$$

If the values of $dU_i/dT$ and $dU_i/dy_i$ are known or have been previously determined experimentally from measurements performed on single-material battery cells, the values of $f_i$ can be obtained from measurements of dU/dT for the blended electrode at multiple SOC (i.e., y) values. Because the value of each $y_i$ is known from the value of U ($=U_i$) for the blended electrodes, for a given set of $f_i$ there is a unique value of dU/dT for every SOC of the blended electrode.

All $U_i$ values, and therefore U, are monotonic with $y_i$ and $y_i$ respectively. Hence, for a given $U=U_i$, there are unique values of y and $y_i$. Starting with an arbitrary value of U, we obtain through $U=U_i$ all values of $y_i$. From a set of $f_i$, we further obtain the value of y via equation (1) and dU/dT via equation (7). We can obtain the entire function of dU/dT vs. y by sweeping through all possible values of U and repeating the above procedure. For each y and set of $f_i$ there is one and only one value of dU/dT, although dU/dT may be nonmonotonic in y.

In some implementations, an intrinsic SOC is not measured, but rather a change in capacity of the electrode between the measurements of dU/dT. Therefore, at least n measurements of dU/dT at known differential capacities (i.e., a change in capacity from a reference state) are needed to obtain a complete set of $f_i$ as well as the total electrode capacity (or, equivalently, total amount of active lithium-insertion material) for n distinct active materials. Additional measurements are desirable in order to reduce the uncertainty in fi introduced by measurement errors. Furthermore, we have not shown that a given set of dU/dT vs. differential capacity uniquely describes a set of $f_i$ and total electrode capacity, although typical dUi/dT functions for battery electrode materials are rich enough that <3n/2 measurements are required to obtain a good fit of $f_i$ and electrode capacity.

Moreover, measurements of U and dU/dT can be obtained during a single measurement at a particular value of differential capacity. Thus, a combination of U and dU/dT measurements can be used to obtain the electrode capacity and set of $f_i$. In principal, only n/2 measurements, in which both U and dU/dT are obtained at each of n/2 differential capacities, is sufficient to fit $f_i$ and the total capacity. This reduction in number of measurements can reduce the time required to obtain the electrode capacity and set of $f_i$ when the timescale for thermal diffusion is less than the timescale for chemical diffusion. Typical lithium diffusion relaxation times are on the order of hours, particularly at low potentials, whereas thermal relaxation times are on the order of minutes or even seconds, depending upon the cell size.

Using measurements of dU/dT is also advantageous when working with materials that have relatively flat U vs. SOC functions, such as graphite. In embodiments in which an electrode comprises a material having a relatively flat U vs. SOC relationship (e.g., graphite) the relationship between dU/dT and SOC may vary more rapidly (e.g., graphite). In such systems the dual measurement of both dU/dT and U at each value of differential capacity may allow a more rapid and more accurate estimation of the capacity of the battery than by measurement of U alone. For example, the dependence of dU/dT on SOC has much more relative variation between y values of 0.25 and 0.45 in $Li_yMn_2O_4$ than does the dependence of U on SOC as reported by Karen Thomas, "Lithium Ion Batteries: Thermal and Interfacial Phenomena," PhD Thesis, UC Berkeley (2002), the entire content of which is hereby incorporated by reference.

For a full-cell system, the open-circuit potential (OCP) of an electrochemical cell results from the differences between the OCPs of the positive and negative electrodes:

$$U_{cell}(SOC) = U_+(y_+) - U_-(y_-) \tag{8}$$

and therefore, $$\left(\frac{\partial U_{cell}}{\partial T}\right)_{SOC} = \frac{\sum_j f_{+,j} \left(\frac{\partial U_{+,j}}{\partial T}\right)_{y_{+,j}} \left(\frac{\partial U_{+,j}}{\partial y_{+,j}}\right)_T^{-1}}{\sum_j f_{+,j} \left(\frac{\partial U_{+,j}}{\partial y_{+,j}}\right)_T^{-1}} - \frac{\sum_i f_{-,i} \left(\frac{\partial U_{-,i}}{\partial T}\right)_{y_{-,i}} \left(\frac{\partial U_{-,i}}{\partial y_{-,i}}\right)_T^{-1}}{\sum_i f_{-,i} \left(\frac{\partial U_{-,i}}{\partial y_{-,i}}\right)_T^{-1}} \tag{9}$$

Note that the value of SOC for the full cell corresponds to a relationship between the composite values of y for the positive and negative electrodes, respectively. This relationship can change with age. Hence, we have one additional fitting parameter, the relationship between $y_+$ and $y_-$ at a particular differential capacity, which cannot be obtained directly from full-cell voltage measurements. Typically we fit the total amount of "cyclable lithium" contained in the cell (i.e., sum of amount of lithium in both electrodes), which is equivalent to specifying the relationship between $y_+$ and $y_-$ at a particular differential capacity. Let $n_{Li}$ represent the total amount of cyclable lithium.

If there are m positive electrode materials and n negative electrode materials, the minimum number of independent measurements of $dU_{cell}/dT$ required to obtain a complete set of C+, C−, $n_{Li}$, $f_{+,j}$, and $f_{-,i}$ is m+n+1, where C+ and C− are the total capacities of the positive and negative electrodes, respectively. The set of equations we have at our disposal to determine these "state of health" (SOH) parameters is:

$$U_{cell}(\Delta C_k) = U_+(y_+^k) - U_-(y_-^k) \tag{10}$$

and $$\left(\frac{\partial U_{cell}}{\partial T}\right)_{\Delta C_k} = \frac{\sum_j f_{+,j} \left(\frac{\partial U_{+,j}}{\partial T}\right)_{y_{+,j}^k} \left(\frac{\partial U_{+,j}}{\partial y_{+,j}^k}\right)_T^{-1} - \sum_i f_{-,i} \left(\frac{\partial U_{-,i}}{\partial T}\right)_{y_{-,i}^k} \left(\frac{\partial U_{-,i}}{\partial y_{-,i}^k}\right)_T^{-1}}{\sum_j f_{+,j} \left(\frac{\partial U_{+,j}}{\partial y_{+,j}^k}\right)_T^{-1} - \sum_i f_{-,i} \left(\frac{\partial U_{-,i}}{\partial y_{-,i}^k}\right)_T^{-1}}, \tag{11}$$

where $\Delta C_k$ is the difference in capacity from some reference state. These equations can be used in any combination, provided the total number of equations is at least m+n+1. Again, the preference would be to use a compact set of measurements in which both $U_{cell}$ and $dU_{cell}/dT$ are measured at each $\Delta C_k$.

Methods for measuring the value of dU/dT at a given SOC for a given material (e.g., the potentiometric and the calorimetric techniques) are described by Karen Thomas, Lithium Ion Batteries: Thermal and Interfacial Phenomena, PhD Thesis, UC Berkeley (2002). Besides using the methods for measuring the value of dU/dT at a given SOC for a given material, a battery management system as described herein may use the above described methods to further measure dU/dT for a complete electrochemical cell consisting of one or more active materials in each of the positive and negative electrodes.

Some systems and methods that implement the measurement of dU/dT on battery cell are configured to account for control of temperature and for achieving sufficiently long rest periods to measure the equilibrium open-circuit potential of a cell (or a plurality of cells).

In some implementations, the temperature of the cell or plurality of cells in a battery system is controlled and maintained in order to measure both temperature and a stable value of the cell open-circuit potential at the temperature. The temperature of the cells can be influenced during charging and during periods of rest by various methods including, for example, changing the flow rate during cooling, actively heating the cells from neighboring cells (possibly via a fluid medium), and redirect/reverse flow within the battery system (e.g., front to back becomes back to front). A thermal model of the battery system can be used to achieve a target temperature for a given cell or plurality of cells.

In order to achieve sufficiently long rest periods to measure equilibrium open-circuit potential, some implementations are configured to take a battery cell or group of cells "offline" (e.g., deactivate at least one battery cell) into a quiescent mode during battery operation, in which temperature T naturally varies. The battery cell or group of cells can take a long time to reach a quasi-equilibrium state. Accordingly, taking a cell or group of cells offline allows a battery management system to measure equilibrium open-circuit potential even while the battery is being used. The battery cell or group of cells can be brought back online (e.g., reactivate at least one battery cell), with cell balancing, during the next battery charge. Alternatively, the battery cell or group of cells can be brought online during dynamic operation with cell balancing.

In other implementations, a "monitor only mode" is used to track cell potentials and temperatures during natural rest periods. Data is stored in memory when dU/dT is less than a critical or threshold value (e.g., 10 or 1 millivolt per hour (mV/hour)). Function fitting is then performed after enough data points have been collected (e.g., over a week). Such systems are also configured to include a state estimator, such as for example a Coulomb counter, in order to estimate the differential capacity at the time that dU/dT is measured.

FIG. 1 illustrates one example of a battery system 10 implementing the state determination features discussed above. The system 10 includes a battery management system 12 and a battery 14. The battery management system 12 includes an electronic processor 16 (e.g., a microprocessor) and a non-transitory computer-readable memory 18. The memory 18 stores instructions that are executed by the processor 16 to control the operation of the system 10. The battery 14 includes an anode 20 and a cathode 22. A voltage sensor 24 is coupled to the battery management system 12 and to the battery 14 to measure a voltage of the battery 14 and to provide a signal indicative of the measured voltage to the battery management system 12. The system 10 also includes a temperature sensor 26 positioned to measure a temperature of one or more of the battery cells of the battery 14 and is communicatively coupled to the processor 16 to transmit a signal indicative of the measured temperature(s). In some embodiments, the system 10 includes one or more sensors coupled to the battery management system 12 and the battery 14 to measure a current of the battery 14. In the above embodiments, the battery management system 12 can receive a measure of the voltage of the battery 14 from the voltage sensor 24 and a temporally corresponding measurement of the current and the temperature of the battery 14.

The battery management system 12 is configured to estimate the open circuit potential (OCP) from a battery voltage measured by the voltage sensor 24. That is, the battery management system 12 uses the voltage from the voltage sensor 24 to determine when the battery 14 is at equilibrium (i.e., when the voltage=OCP). The battery management system 12 can determine when the battery 14 is at equilibrium by tracking the rate of change in voltage over time during periods of zero current. For example, if the battery management system 12 determines that the rate of change dV/dt during periods of zero current (or negligible current) is below a threshold value, then the battery management system 12 can determine that the battery 14 is in a quasi-equilibrium state and approximate the measured voltage of the battery 14 as the OCP.

Figure 2:
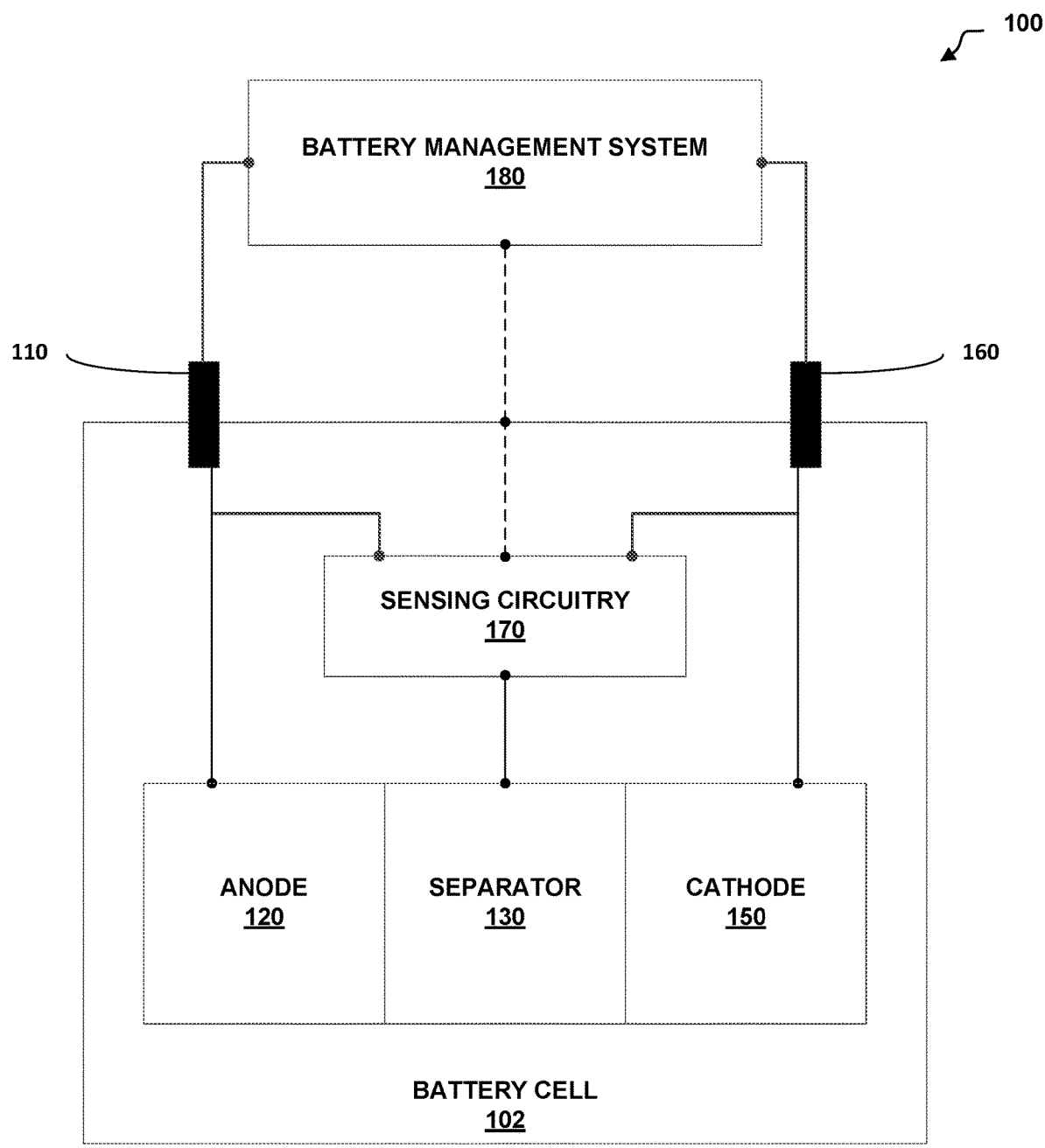
FIG. 2 is a block diagram of another battery system including a battery cell and a battery management system with sensing circuitry provided external to the battery cell, in accordance with some embodiments.

FIG. 2 illustrates another example of a battery system 100 includes a battery cell 102, an anode tab 110, an anode 120, a separator 130, a cathode 150, a cathode tab 160, sensing circuitry 170, and a battery management system 180 that implements the state determination features discussed above. In the example of FIG. 2, the sensing circuitry 170 may be located within the battery cell 102. In some examples, the separator 130 may be an electrically insulating separator. In some embodiments, the electrically insulating separator comprises a porous polymeric film. In various embodiments the thickness dimension of the components of the battery cell 102 may be for the anode 120 about 5 to about 110 micrometers, for the separator 130 less than about 50 micrometers or in certain embodiments less than about 10 micrometers, and for the cathode 150 about 50 to about 110 micrometers.

During the discharge of a lithium battery cell 102, lithium is oxidized at the anode 120 to form a lithium ion. The lithium ion migrates through the separator 130 of the battery cell 102 to the cathode 150. During charging the lithium ions return to the anode 120 and are reduced to lithium. The lithium may be deposited as lithium metal on the anode 120 in the case of a lithium anode 120 or inserted into the host structure in the case of an insertion material anode 120, (e.g., graphite), and the process is repeated with subsequent charge and discharge cycles. In the case of a graphitic or other Li-insertion electrode, the lithium cations are combined with electrons and the host material (e.g., graphite), resulting in an increase in the degree of lithiation, or "state of charge" of the host material. For example, x $Li^+$+x $e^-$+$C_6$→$Li_xC_6$.

The anode 120 may comprise an oxidizable metal, such as lithium, or an insertion material that can insert Li or some other ion, such as Na, Mg, etc. The cathode 150 may comprise various materials such as sulfur or sulfur-containing materials (e.g., polyacrylonitrile-sulfur composites (PAN-S composites), lithium sulfide ($Li_2S$)); vanadium oxides, such as vanadium pentoxide ($V_2O_5$); metal fluorides, such as fluorides of titanium, vanadium, iron, cobalt, bismuth, copper and combinations thereof; lithium-insertion materials, such as lithium nickel manganese cobalt oxide (NMC), lithium-rich NMC, lithium nickel manganese oxide ($LiNi_{0.5}Mn_{1.5}O_4$), lithium-rich layered oxides, such as, lithium cobalt oxide ($LiCoO_2$), lithium iron phosphate ($LiFePO_4$), lithium manganese oxide ($LiMn_2O_4$), lithium nickel cobalt aluminum oxide (NCA), and combinations thereof. The particles may further be suspended in a porous, electrically conductive matrix that includes polymeric binder and electronically conductive material such as carbon (carbon black, graphite, carbon fiber, etc.). In some examples, the cathode may comprise an electrically conductive material having a porosity of greater than about 80 percent to allow the formation and deposition/storage of oxidation products such as lithium peroxide ($Li_2O_2$) or lithium sulfide, ($Li_2S$) in the cathode volume. The ability to deposit the oxidation product directly determines the maximum power obtainable from the battery cell. Materials which provide the needed porosity include carbon black, graphite, carbon fibers, carbon nanotubes, and other non-carbon materials. The pores of the cathode 150, separator 130, and anode 120 are filled with an ionically conductive electrolyte that contains a salt such as lithium hexafluorophosphate ($LiPF_6$) that provides the electrolyte with an adequate conductivity which reduces the internal electrical resistance of the battery cell. The electrolyte solution enhances ionic transport within the battery cell. Various types of electrolyte solutions are available including, non-aqueous liquid electrolytes, ionic liquids, solid polymers, glass-ceramic electrolytes, and other suitable electrolyte solutions.

The separator 130 may comprise one or more electrically insulating ionic conductive materials. In some examples, separator 130 materials may include porous polymers, ceramics, and two dimensional sheet structures (e.g., graphene, boron nitride, dichalcogenides) and combinations thereof.

The battery management system 180 is communicatively connected to the battery cell 102. In one example, the battery management system 180 is electrically connected to the battery cell 102 via one or more electrical links (e.g., wires as illustrated by the solid lines in FIG. 2). In another example, the battery management system 180 may be wirelessly connected to the battery cell 102 via a wireless communication network. The battery management system 180 may include for example a microcontroller (with memory and input/output components on a single chip or within a single housing) or may include separately configured components, for example, a microprocessor, memory, and input/output components. The battery management system 180 may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 180 may also include a user interface, a communication interface, and other computer implemented devices for performing features not defined herein may be incorporated into the system. In some examples, the battery management system 180 may include other computer implemented devices such as a communication interface, a user interface, a network communication link, and an interface bus for facilitating communication between various interface devices, computing implemented devices, and one or more peripheral interfaces to the microprocessor.

In the example of FIG. 2, the memory of the battery management system 180 stores computer-readable instructions that, when executed by the electronic processor of the battery management system 180, cause the battery management system 180 and, more particularly the electronic processor, to perform or control the performance of various functions or methods attributed to battery management system 180 herein (e.g., calculate a state or parameter of the battery system or regulate the operation of the battery system). The memory may include any non-transitory memory (e.g., a non-transitory computer-readable medium), volatile memory, non-volatile memory, magnetic memory, optical memory, random access memory (RAM), read-only memory (ROM), non-volatile RAM (NVRAM), electrically-erasable programmable ROM (EEPROM), flash memory, or any other digital or analog media. The functions attributed to the battery management system 180 herein may be embodied as software, firmware, hardware or any combination thereof. In one example, the battery management system 180 may be embedded in a computing device and the sensing circuitry 170 may be configured to communicate with the battery management system 180 of the computing device. In this example, the sensing circuitry 170 is configured to have wireless and/or wired communication (e.g., wired communication via the dotted line as illustrated in FIG. 2 or wired communication via the anode tab 110 and the cathode tab 160) with the battery management system 180. For example, the sensing circuitry 170 and the battery management system 180 are configured to communicate with each other via a network. In yet another example, the battery management system 180 is remotely located on a server and the sensing circuitry 170 is configured to transmit data of the battery cell 102 to the battery management system 180. In the above examples, the battery management system 180 may be configured to receive the data and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, or other suitable network.

The battery management system 180 is configured to receive data from the sensing circuitry 170 including current, voltage, resistance, and/or temperature measurements. The battery management system 180 is also configured to determine a condition of the battery cell 102. Based on the determined condition of battery cell 102, the battery management system 180 may alter the operating parameters of the battery cell 102 to maintain the internal structure of the battery cell 102. The battery management system 180 may also notify a user of the condition of the battery cell 102.

In some embodiments the battery cell 102 may be closed system. In such a system after the battery cell 102 is produced the casing is sealed to prevent external elements, such as air and moisture, from entering the battery cell 102. A closed battery cell 102 presents various challenges to the battery management system 180. The closed system does not allow the direct observation of the condition of the components of the battery cell 102. Instead, characteristics of the battery cell 102 (e.g., open circuit voltage, current, resistance, power, temperature, and combinations thereof) are measured by the sensing circuitry 170 and may then be processed and/or evaluated by the battery management system 180 to determine the states and/or parameters of the battery cell 102, (e.g., degree of lithiation, volume fractions of active materials in the anode 120 and cathode 150, total cyclable lithium in the battery cell 102, electrolyte conductivity, radii of particles in the anode 120 and cathode 150, anode 120 particle radius; ion diffusion rates in the anode 120, cathode 150, and electrolyte; intercalation current and transference number; solution conductivity in the anode 120, cathode 150, and electrolyte; cell porosity of the anode 120 and cathode 150; and equilibrium potential of the anode 120 and cathode 150), during operation and/or while at rest.

Figure 3:
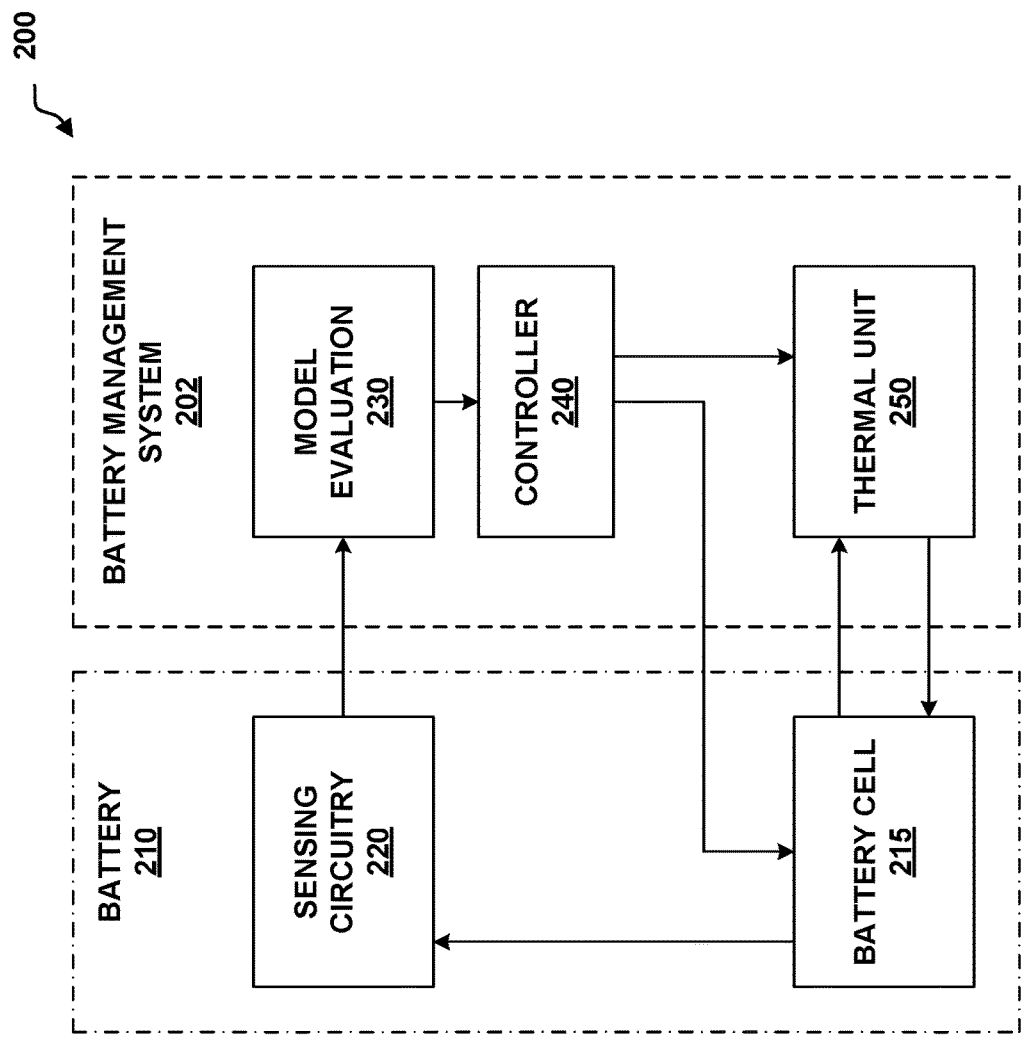
FIG. 3 is a block diagram of a battery system for collecting data points for evaluating capacity fade.

FIG. 3 is a block diagram of a battery system 200 for collecting data points for evaluating capacity fade. The battery system 200 includes a battery management system 202 and a battery 210. The battery management system 202 includes a model evaluation 230, a controller 240, and a thermal unit 250. The battery 210 includes at least one battery cell 215 and sensing circuitry 220. In some embodiments, the battery cell 215 may be similar to the battery cell 102 as described above. The battery 210 is in operable communication with a battery management system 202. For example, the battery management system 202 receives measured characteristics of the battery cell 215 from sensing circuitry 220 (e.g., measurements of voltage, current, resistance, power, temperature, or combinations thereof) within the battery 210. In some embodiments, the battery management system 202 and sensing circuitry 220 may be as described above with respect to the battery management system 180 and sensing circuitry 170 of FIG. 2. In additional embodiments, the battery 210 may be in operable communication with external sources other than the battery management system 202 of the battery system 200.

The battery management system 202 applies an estimation structure to estimate both physical parameters of the battery cell and battery state information. In some embodiments, a model evaluation module 230 of the battery management system 202 receives the measured characteristics for the sensing circuitry 220 and employs at least one battery model to estimate the states and/or parameters of the battery cell 215, (e.g., degree of lithiation, volume fractions of active materials in the anode 120 and cathode 150, total cyclable lithium in the battery cell 215, electrolyte conductivity, radii of particles in the anode 120 and cathode 150, anode 120 particle radius, ion diffusion rates in the anode 120, cathode 150, and electrolyte, intercalation current and transference number, solution conductivity in the anode 120, cathode 150, and electrolyte, cell porosity of the anode 120 and cathode 150, equilibrium potential of the anode 120 and cathode 150, other suitable states and/or parameters, or combinations thereof). Various computational battery models have been developed to model the physical processes and electrochemical reactions occurring within the battery cell 215 (e.g., the Newman Model, Single-Particle Model). In some embodiments, the electrochemical models, (e.g., the Newman Model, (*J. Electrochem. Soc.*, Vol. 141, No. 1, January 1994, pp. 1-10), the contents of which are hereby incorporated by reference in their entirety), provide a mathematical model which can be used to estimate the electrochemical processes occurring within the battery cell 102 based on the measured characteristics. In certain embodiments, the estimated states and/or parameters may be used to estimate the capacity fade of the battery cell 215.

Accurate estimates of the battery state of health, including the extent and type of capacity fade, in turn enable better estimates of battery state of charge and power capability over the lifetime of the battery 210. Moreover, accurate estimates of the extent and type of capacity fade enable the battery management system 202 to more efficiently manage the operation of the battery 210 (e.g., the charge and discharge rates). In certain applications (e.g., hybrid-electric vehicles) in which the entire available capacity range of the battery is not accessed during normal operation, the estimation of the total capacity of the battery 210 by the battery management system 202 may be based on the battery model. In some embodiments, the information required for the estimation of the total capacity of the battery 210 includes a knowledge of the open-circuit potentials (U) of the active materials in the positive and negative electrodes as a function of temperature (dU/dT) and the state of charge (e.g., as a function of lithium content in materials used in lithium-ion batteries), and estimates (or measures) of the open-circuit potential of the full cell as a function of the temperature and state of charge of the battery 210. The relationships between the between active electrode material capacities, cyclable lithium, and dU/dT of a blended electrode and a complete battery cell 102 are described above.

Figure 4:
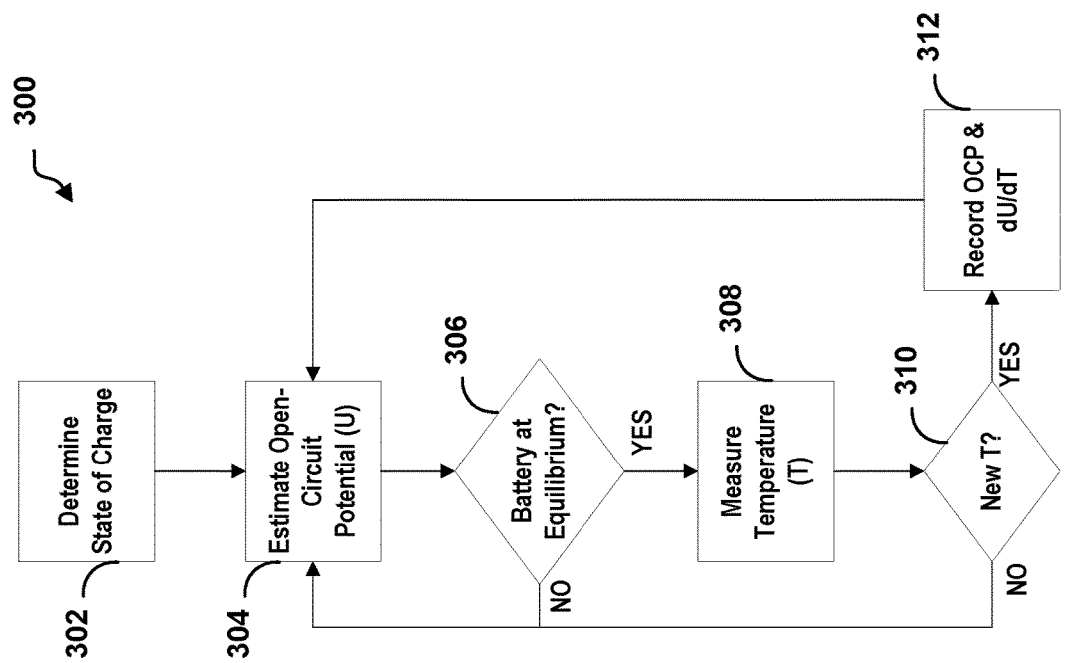
FIG. 4 is a flowchart of a first method for collecting data points for evaluating capacity fade in the system of FIG. 1.

FIG. 4 is a first example of a method 300 for collecting dU/dT data can then be used to determine the total electrode capacity of the battery 14 of FIG. 1 as discussed above. At block 302, the battery management system 10 determines a state of charge of the battery 14. At block 304, the battery management system 10 measures a voltage of the battery 14 and estimates an open-circuit potential (U) (e.g., estimates the open circuit potential based on one of the measured voltage of the battery, a mathematical model, or other suitable method) of the battery 14. At decision block 306, the battery management system 10 determines whether the measured voltage indicates that the battery 14 is at equilibrium (e.g., the rate of change in voltage over time during periods of zero current). If the battery management system 10 determines the measured voltage does not indicate that the battery 14 is at equilibrium ("NO" at decision block 306), at block 304, the battery management system 10 re-measures a voltage of the battery 14 and estimates an open-circuit potential (U) of the battery 14.

If the battery management system 10 determines the measured voltage indicates that the battery 14 is at equilibrium ("YES" at decision block 306), at block 308, the battery management system 10 measures the temperature (T) of the battery 14. At decision block 310, the battery management system 10 determines whether a ratio of a change in open-circuit potential relative to a change in temperature (dU/dT) has been recorded at the measured temperature during this period of SOC equilibrium. If the battery management system 10 determines that the ratio of the change in open-circuit potential relative to the change in temperature has been recorded ("NO" at decision block 310), at block 304, the battery management system 10 re-measures a voltage of the battery 14 and estimates an open-circuit potential (U) of the battery 14. If the battery management system 10 determines that the ratio of the change in open-circuit potential relative to the change in temperature has not been recorded ("YES" at decision block 310), at block 312, the battery management system 10 then determines and records the measured and estimated data and uses the measured and estimated data to determine a dU/dT for the given SOC. After determining the dU/dT for the given SOC, at block 304, the battery management system 10 continues to monitor the battery 14 at block 304. For example, the battery management system 10 repeats the method 300 to measure another voltage/temperature data point and estimate another open circuit potential data point. The method 300 is repeated by the battery management system 10 for a variety of different temperature values allowing the battery management system 10 to determine an appropriate ratio of a change in open-circuit potential relative to a change in temperature (dU/dT) for the battery 14 at the current state of charge.

In the method 300 of FIG. 4, the battery management system 10 is configured to monitor for naturally occurring variations in temperature of the battery 14 and, when such changes are detected, recording new relevant data points. In contrast, as discussed above, some battery management systems are configured to controllably vary the temperature to ensure that more data points are collected more rapidly.

Figure 5:
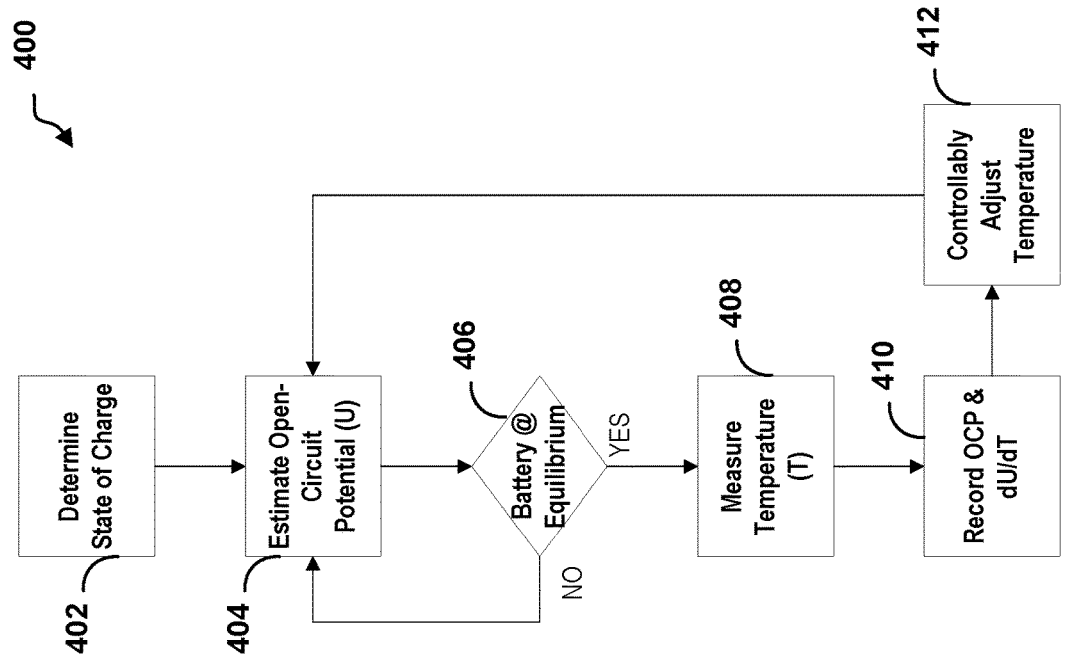
FIG. 5 is a flowchart of a second method for collecting data points for evaluating capacity fade in the system of FIG. 1.

In the method 400 of FIG. 5, at block 402, the battery management system 10 determines a state of charge of the battery 14. At block 404, the battery management system 10 measures a voltage of the battery 14 and estimates an open-circuit potential (U) (e.g., estimates the open circuit potential based on one of the measured voltage of the battery, a mathematical model, or other suitable method) of the battery 14. At decision block 406, the battery management system 10 determines whether the measured voltage indicates that the battery 14 is at equilibrium (e.g., the rate of change in voltage over time during periods of zero current). If the battery management system 10 determines the measured voltage does not indicate that the battery 14 is at equilibrium ("NO" at decision block 406), at block 404, the battery management system 10 re-measures a voltage of the battery 14 and estimates an open-circuit potential (U) of the battery 14.

If the battery management system 10 determines the measured voltage indicates that the battery 14 is at equilibrium ("YES" at decision block 406), at block 408, the battery management system 10 measures the temperature (T) of the battery 14. At block 410, the battery management system 10 then determines and records the measured and estimated data (e.g., the open-circuit potential) and uses the measured and estimated data to determine a dU/dT for the given SOC. After determining the dU/dT for the given SOC, at block 412, the battery management system 10 controllably adjusts the temperature of the battery 14 (e.g., by cycling a coolant fluid, adjusting a flow rate of coolant fluid, adjusting a flow direction of coolant fluid, or other suitable temperature adjustment). After controllably adjusting the temperature of the battery 14, the battery management system 10 continues to monitor the battery 14 at block 404. For example, the battery management system 10 repeats the method 400 to measure another voltage/temperature data point and estimate another open circuit potential data point. The method 400 is repeated by the battery management system 10 for a variety of different temperature values allowing the battery management system 10 to determine an appropriate ratio of a change in open-circuit potential relative to a change in temperature (dU/dT) for the battery 14 at the current state of charge.

Figure 6:
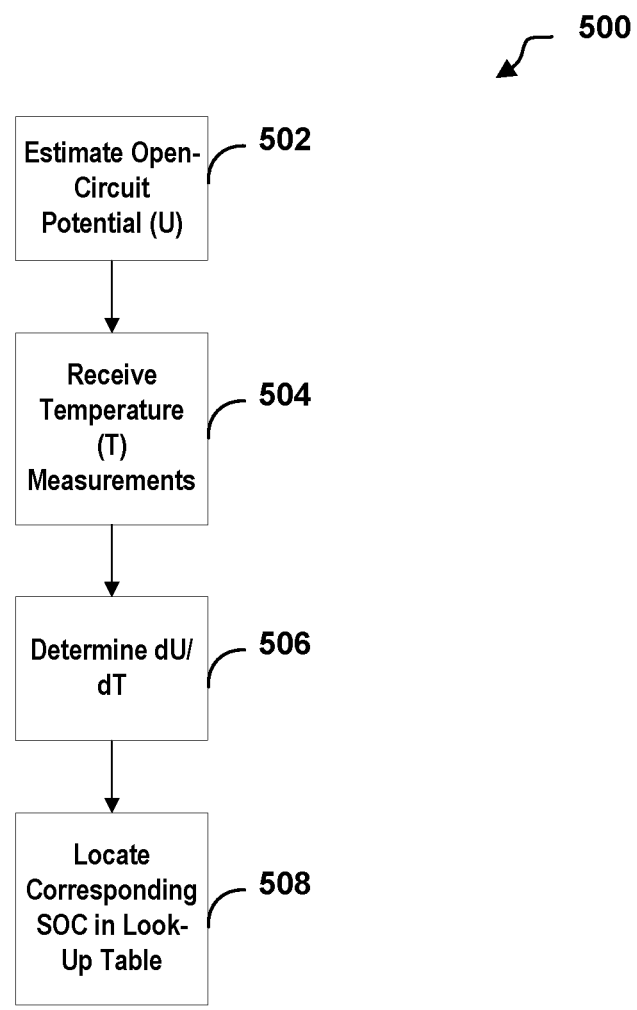
FIG. 6 is a flowchart of a method for determining a current state of charge of a battery in the system of FIG. 1 based on experimentally collected data points from a method such as illustrated in FIG. 4 or 5.

As discussed in detail above, once a sufficient number of dU/dT data points have been collected, the battery management system 10 can use this information to develop an appropriate SOC curve and thereby determine a maximum charge capacity for the battery 14. In some embodiments, the battery management system 10 is further configured to develop a look-up table based on the charge curve to provide a simplified mechanism for estimating a state of charge for the battery based on a determined dU/dT. One such example is illustrated in the method 500 of FIG. 6. In the example of FIG. 6, at block 502, the battery management system 10 estimates the open-circuit potential (U) of one or more battery cells of the battery 14. At block 504, the battery management system 10 receives temperature measurements of the one or more battery cells of the battery cell 14. At block 506, the battery management system 10 determines the dU/dT of the battery 14 as discussed above. At block 508, the battery management system 10 then accesses a look-up table stored in the memory (e.g., memory of the battery management system 10) to identify or locate a SOC value that corresponds to the determined dU/dT of the battery 14. The SOC value can be used by the battery management system 10 to determine the extent and type of capacity fade of the battery 14.

Figure 7:
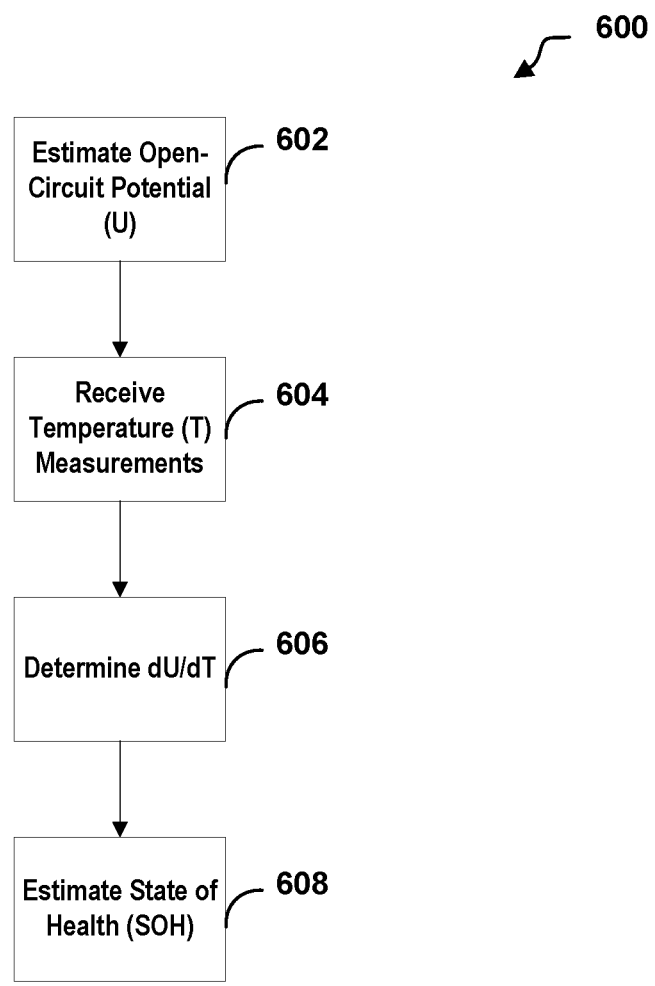
FIG. 7 is a flowchart of a method for determining a current state of health of a battery in the system of FIG. 1 based on experimentally collected data points from a method such as illustrated in FIG. 4 or 5.

In some embodiments, the battery management system 10 is further configured to estimate the state of health of the battery 14. One such example is illustrated in the method 600 of FIG. 7. In the example of FIG. 7, at block 602, the battery management system 10 estimates the open-circuit potential (U) of one or more battery cells of the battery 14. At block 604, the battery management system 10 receives temperature measurements of the one or more battery cells of the battery cell 14. At block 606, the battery management system 10 determines the dU/dT of the battery 14 as discussed above. At block 608, the battery management system 10 estimates a state of health (e.g., degree of lithiation, volume fractions of active materials in the anode 120 and cathode 150, total cyclable lithium in the battery cell 215, cell porosity of the anode 120 and cathode 150, equilibrium potential of the anode 120 and cathode 150, other suitable states and/or parameters, or combinations thereof) of the battery cell 14 from the estimation of the open circuit potential (U) and the determination of the dU/dT. The battery management system 10 can use the estimation of the state of health of the battery 14 in the determination of the extent and type of capacity fade of the battery 14 as described above.

Thus, the invention provides, among other things, a system and method for evaluating charge capacity of a battery system based on experimentally collected data concerning a ratio of a change in open-circuit potential relative to a change in temperature. Various features and advantages of the invention are set forth in the following claims.

What is claimed is:

1. A method of managing a battery system, the battery system including at least one battery cell and one or more sensors configured to measure a temperature of the at least one battery cell, the method comprising:
   receiving, by a computer-based battery management system from the one or more sensors, a measurement of the temperature of the at least one battery cell;
   estimating, by the battery management system, an open circuit potential of the at least one battery cell;
   estimating, by the battery management system, a capacity fade of the at least one battery cell based on the open circuit potential of the at least one battery cell and a ratio of a change in the open circuit potential relative to a change in the temperature of the at least one battery cell; and
   regulating, by the battery management system, at least one of charging or discharging of the at least one battery cell based on the estimation of the capacity fade.

2. The method of claim 1, wherein the one or more sensors are further configured to measure a voltage and a current of the at least one battery cell, the method further comprising receiving, by the battery management system from the one or more sensors, a measurement of the voltage of the at least one battery cell and a temporally corresponding measurement of the current and the temperature of the at least one battery cell.

3. The method of claim 2, wherein estimating the open circuit potential of the at least one battery cell includes estimating the open circuit potential to be equal to the voltage of the at least one battery cell when the at least one battery cell is in a quasi-equilibrium state, wherein the quasi-equilibrium state occurs when the current is negligible and a rate of change of the voltage over time is below a threshold value.

4. The method of claim 3, wherein the threshold value is less than 3 millivolts per hour.

5. The method of claim 3, further comprising: deactivating the at least one battery cell to achieve the quasi-equilibrium state; and responsive to estimating the open circuit potential, reactivating the at least one battery cell.

6. The method of claim 2, wherein estimating the open circuit potential of the at least one battery cell includes fitting a decaying exponential of the voltage over time to extrapolate a value of the open circuit potential.

7. The method of claim 1, wherein estimating the open circuit potential of the at least one battery cell includes estimating a value of the open circuit potential with a mathematical model of the at least one battery cell and parameter estimation algorithms when the at least one battery cell is under load.

8. The method of claim 1, further comprising: controllably varying, by the battery management system, the temperature of the at least one battery cell; receiving, by the battery management system from the one or more sensors, a plurality of estimates of the open circuit potential, wherein each estimate of the plurality of estimates is at a temporally corresponding temperature as the temperature of the at least one battery cell is varied; and storing each estimate of the plurality of estimates of the open circuit potential and the temporally corresponding measurement of the temperature to a non-transitory computer-readable memory.

9. The method of claim 8, further comprising determining at least one state of the at least one battery cell corresponding to each estimate of the plurality of estimates of the open circuit potential and the temporally corresponding temperature of the at least one battery cell, the at least one state being selected from a group consisting of a state of charge and a state of health, and wherein estimating the capacity fade of the at least one battery cell includes determining a change in the open circuit potential relative to a change in temperature for each of a plurality of states of charge, and estimating a total capacity of the at least one battery cell based on the change in the open circuit potential relative to the change in temperature for each of the plurality of states of charge.

10. The method of claim 9, further comprising determining a current state of charge of the at least one battery cell by accessing a table stored in the non-transitory computer-readable memory, the table defining an experimentally determined ratio of the change in open circuit potential relative to the change in the temperature for each of a plurality of state of charge values; controllably varying the temperature of the at least one battery cell at the current state of charge; measuring the open circuit potential and the temporally corresponding temperature at each of a plurality of temperatures; determining a current ratio of the change in open circuit potential relative to the change in temperature; and identifying, using the table, the state of charge value of the plurality of state of charge values corresponding to the current ratio of the change in open circuit potential relative to the change in the temperature.

11. The method of claim 8, wherein varying the temperature of the at least one battery cell includes changing, by the battery management system, a flow rate of coolant.

12. The method of claim 8, wherein varying the temperature of the at least one battery cell includes actively heating, by the battery management system, the at least one battery cell via a fluid medium.

13. The method of claim 8, wherein varying the temperature of the at least one battery cell includes changing, by the battery management system, a flow direction of coolant.

14. A battery system comprising:
   at least one battery cell;
   one or more sensors configured to measure a temperature of the at least one battery cell; and
   a battery management system including an electronic processor configured to receive a measurement of the temperature of the at least one battery cell from the one or more sensors, estimate an open circuit potential of the at least one battery cell, estimate a capacity fade of the at least one battery cell based on the open circuit potential of the at least one battery cell and a ratio of a change in the open circuit potential relative to a change in the temperature of the at least one battery cell, and regulate at least one of charging or discharging of the at least one battery cell based on the capacity fade.

15. The system of claim 14, wherein the one or more sensors are further configured to measure a voltage and a current of the at least one battery cell, the electronic processor of the battery management system further configured to receive a measurement of the voltage of the at least one battery cell and a temporally corresponding measurement of the current and the temperature of the at least one battery cell from the one or more sensors.

16. The system of claim 15, wherein, to estimate the open circuit potential of the at least one battery cell, includes the electronic processor configured to estimate the open circuit potential to be equal to the voltage of the at least one battery cell when the at least one battery cell is in a quasi-equilibrium state, wherein the quasi-equilibrium state occurs when the current is negligible and a rate of change of the voltage over time is below a threshold value.

17. The system of claim 16, wherein the electronic processor is further configured to deactivate the at least one battery cell to achieve the quasi-equilibrium state, and responsive to estimating the open circuit potential of the at least one battery cell, reactivate the at least one battery cell.

18. The system of claim 14, wherein, to estimate the open circuit potential of the at least one battery cell, includes the electronic processor configured to estimate a value of the open circuit potential with a mathematical model of the at least one battery cell and parameter estimation algorithms when the at least one battery cell is under load.

19. The system of claim 14, wherein the electronic processor is further configured to controllably vary the temperature of the at least one battery cell, receive a plurality of estimates of the open circuit potential from the one or more sensors, wherein each estimate of the plurality of estimates of the open circuit potential is at a different temporally corresponding temperature as the temperature of the at least one battery cell is varied, and store the plurality of estimates of the open circuit potential from the one or more sensors in a computer-readable memory.

20. The system of claim 19, wherein the electronic processor is further configured to determine at least one of a state of the at least one battery cell corresponding to each estimate of the open circuit potential and the temporally corresponding temperature of the at least one battery cell, the at least one state being selected from a group consisting of a state of charge and a state of health, and wherein, to estimate the capacity fade of the at least one battery cell, includes the electronic processor configured to determine a change in the open circuit potential relative to a change in temperature for each of a plurality of states of charge, and estimate a total capacity of the at least one battery cell based on the change in the open circuit potential relative to the change in the temperature for each of the plurality of states of charge.

* * * * *